United States Patent
Pichler et al.

(10) Patent No.: US 11,720,778 B2
(45) Date of Patent: Aug. 8, 2023

(54) VOLTAGE LIMITER

(71) Applicant: NXP B.V., Eindhoven (NL)

(72) Inventors: Thomas Pichler, Graz (AT); Ivan Jesus Rebollo Pimentel, Graz (AT)

(73) Assignee: NXP B.V., Eindhoven (NL)

( * ) Notice: Subject to any disclaimer, the term of this patent is extended or adjusted under 35 U.S.C. 154(b) by 176 days.

(21) Appl. No.: 17/445,752

(22) Filed: Aug. 24, 2021

(65) Prior Publication Data

US 2023/0064494 A1  Mar. 2, 2023

(51) Int. Cl.
  *G08B 13/14* (2006.01)
  *G06K 19/07* (2006.01)
  *H03K 17/693* (2006.01)

(52) U.S. Cl.
  CPC ..... *G06K 19/0713* (2013.01); *G06K 19/0715* (2013.01); *G06K 19/0726* (2013.01); *H03K 17/693* (2013.01)

(58) Field of Classification Search
  CPC ........... G06K 19/0713; G06K 19/0715; G06K 19/0726; H03K 17/693; H02M 3/073; H02M 1/32; H02M 1/322; H04B 5/0037
  See application file for complete search history.

(56) References Cited

U.S. PATENT DOCUMENTS

| | | | |
|---|---|---|---|
| 6,304,613 B1 | 10/2001 | Koller et al. | |
| 7,786,870 B2 | 8/2010 | Zettler | |
| 8,665,007 B2 | 3/2014 | Ochoa et al. | |
| 8,687,395 B2* | 4/2014 | El Waffaoui | H02M 7/217 327/427 |
| 9,542,639 B1* | 1/2017 | Buescher | G06K 19/0715 |
| 9,911,076 B2 | 3/2018 | Nozoe | |
| 2009/0236428 A1* | 9/2009 | Koyama | G06K 19/0713 235/487 |
| 2010/0084467 A1* | 4/2010 | Nishido | G06K 19/0701 235/492 |
| 2016/0004890 A1 | 1/2016 | Battista et al. | |

FOREIGN PATENT DOCUMENTS

| | | |
|---|---|---|
| BR | 102015006648 A2 | 9/2016 |
| BR | 102016021944 A2 | 4/2018 |
| CN | 109685191 A | 4/2019 |

* cited by examiner

*Primary Examiner* — Toan N Pham

(57) ABSTRACT

A voltage limiter incorporated in a radio frequency identification (RFID) integrated circuit (IC) for a RFID tag is disclosed. The RFID IC includes a radio frequency (RF) rectifier and a clock generator. The RF rectifier is configured to convert an AC signal received from an antenna incorporated in the RFID tag to a DC signal. The voltage limiter includes a current sink device coupled between output of the RF rectifier and ground and a charge pump to control conduction of current through the current sink device to limit output voltage of the RF rectifier to a predefined voltage level.

15 Claims, 3 Drawing Sheets

VOLTAGE LIMITER

BACKGROUND

Radio Frequency Identification (RFID) refers to a wireless system comprised of two components: tags and readers. The reader is a device that has one or more antennas that emit radio waves and receive signals back from the RFID tag. Tags, which use radio waves to communicate their identity and other information to nearby readers, can be passive or active. Passive RFID tags are powered by the reader and do not have a battery. Active RFID tags are powered by batteries. Near Field Communication (NFC) is a wireless communication technology that acts over short distances for two-way communication. The use of NFC tags is growing in several markets, including the medical, consumer, retail, industrial, automotive, and smart grid markets. NFC is a type of RFID technology. Due to internal or external factors such as distance from the other device or tag, nearby objects, etc. the tag needs to be tuned to balance the impedance to optimize the received signal strength before a data read cycle starts. Further, the internal components of a tag need to be protected from overvoltage.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a voltage limiter incorporated in a radio frequency identification (RFID) integrated circuit (IC) for a RFID tag, is disclosed. The RFID IC includes a radio frequency (RF) rectifier a clock generator. The RF rectifier is configured to convert an AC signal received from an antenna incorporated in the RFID tag to a DC signal. The voltage limiter includes a current sink device coupled between output of the RF rectifier and ground and a charge pump to control conduction of current through the current sink device to limit output voltage of the RF rectifier to a predefined voltage level.

In some examples, the output of the charge pump is controlled by a clock signal generated by the clock generator. The charge pump includes a first port and a second port and the first port is coupled with the clock signal and the second port is coupled with inverse of the clock signal. The input of the charge pump is coupled with the output of the RF rectifier. A voltage regulator may be coupled between the output of the RF rectifier and input of the charge pump. The frequency of the clock signal is controlled by a reference voltage that is derived from the output of the RF rectifier. The power supply port of the clock generator is coupled with the output of the RF rectifier. In some embodiments, the voltage regulator is coupled between the output of the RF rectifier and the power supply port of the clock generator is coupled with the output of the RF rectifier. In some embodiments, the frequency of the clock signal is controlled by a reference voltage signal that is derived from the output of the RF rectifier.

The current sink device may include one of more transistors and one or more gates of the one of more transistors are coupled with the output of the charge pump. A multiplexer may be included and the multiplexer may have a plurality of input ports and one output port. The multiplexer is configured to connect a selected input port in the plurality of input ports to the one output port. In some examples, the charge pump includes a plurality of stages having a plurality of outputs, each of the plurality of outputs is coupled with the plurality of input ports of the multiplexer.

In some examples, the current sink device includes a plurality of transistors having a plurality of gates and the charge pump includes a plurality of stages having a plurality of outputs, wherein the plurality of outputs of the plurality of stages are coupled with the plurality of gates. The plurality of transistors are coupled between the output of the RF rectifier and ground. A plurality of switches may be coupled between the plurality of transistors and ground.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Figure 1:
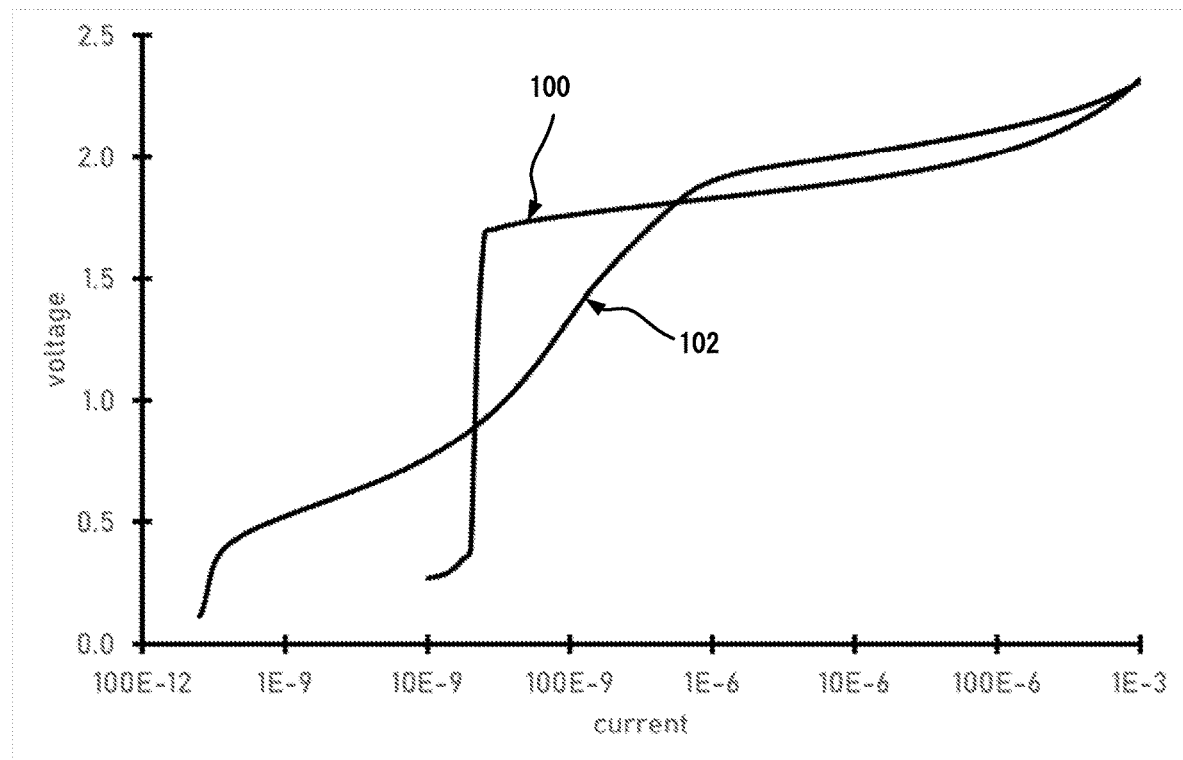
FIG. 1 depicts a graph for input voltage and current sunk by a typical limiter and an improved limiter described herein in accordance with one or more embodiments of the present disclosure.

Note that figures are not drawn to scale. Not all components of the DC voltage limiter circuit are shown. The omitted components are known to a person skilled in the art.

DETAILED DESCRIPTION

Many well-known manufacturing steps, components, and connectors have been omitted or not described in details in the description so as not to obfuscate the present disclosure.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", "one example", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

RFID tags can store a range of information from one serial number to several pages of data. RFID tags can be mobile so that they can be carried by hand, or they can be mounted on a post or overhead. RFID systems can also be built into the architecture of a cabinet, room, or building. NFC is a technology based on RFID technology. NFC technology can be used to provide peer-to-peer communication or one way communication. When two NFC enabled devices are very close to each other, about 4 cm or less, they can communicate with each other using the radio waves. Of the two devices communicating using NFC, at least of them has to be an active device (powered). In many cases, this would be a smartphone, tablet, security pad, or a payment terminal. The other device can be either active or passive (unpowered). Radio Frequency Identification (RAIN) RFID is the adoption of UHF RFID technology in a way similar to other wireless technology organizations including NFC Forum, WiFi Alliance and Bluetooth SIG. RAIN uses the GS1 UHF Gen2 protocol which ISO/IEC has standardized as 18000-63. RAIN is intended as a nod to the link between UHF RFID and the cloud, where RFID-based data can be stored, managed and shared via the Internet. A RAIN RFID solution uses a reader to read and write a tagged item, manage the data and take action. RAIN RFID Tags are either attached to or embedded in items. Tagged items store and send information. RAIN RFID Readers have antenna(s) for either short or long range communication.

In an active peer-to-peer (P2P) mode, two active devices create a wireless communication channel between them. The active device, with an external power supply, can power the passive device with the electromagnetic field coming from the active device. NFC passive devices are used in many applications because the passive NFC device can be a simple tag. NFC devices communicate with each other via radio waves. The active NFC device has to be enabled (turned on) first. The radio waves for NFC are generated using an antenna. NFC works by exploiting the properties of electromagnetic fields, using the inductive coupling between NFC devices. NFC devices operates at the 13.56 MHz frequency, which is a license-free section of HF on the RF spectrum. RAIN RFID devices operates in 800 MHz to 1 GHz.

The strength of the received signal may be dependent on the distance as well as external factors such as nearby objects, human touch, etc. Therefore, in some examples, RFID tags may include a switchable capacitor bank that includes a plurality of capacitors coupled with switches. The value of the capacitor may be changed by turning one or more of these switches on or off. The input impedance of the receiver antenna may be changed by changing the capacitor value to optimize the signal strength of the input signal. A limiter is used to limit the input voltage to a predefined level to protect internal components of the RFID tag from overvoltage. Typically limiter circuits consumes relatively high amount of current even when the input voltage is below the predefined voltage level. The embodiments of the limiter described herein do not sink substantial amount of current until the input voltage reaches the predefined level.

FIG. 1 depicts a graph for input voltage and current sunk by a typical limiter and an improved limiter. The input voltage is derived by rectifying the signals received from an external reader. The graph 102 shows that the typical limiter start to sink current at approximately 0.5V even when the voltage needs to be limited to 2V, for example. A limiter is typically used after the input rectifier stage so that the downstream components can be protected from overvoltage. The overvoltage may occur when the RFID tag is brought in a high field strength region near the reader. RFID tags are low power devices and even a few nano ampere the current sunk by the typical limiter at lower voltages may inhibit the operations of the RFID tag by depriving the other components of the power. For example, a memory reading operation may require a minimum amount of power which may not be available if the limiter starts to sink current at voltages lower than a predefined voltage level. The curve 100 depicts the current sunk by the improved limiter circuit described herein. As shown, the improved limiter does not start to sink current (at least relatively substantially compared to a typical limiter, e.g., the curve 102) until the input voltage reaches a predefined voltage level, e.g., 2V (for example only). Thus, the improved limiter is advantageous because the RFID tag downstream components further from the antenna receive sufficient power at low voltages. The limiter described herein may be configured to limit the current at the predefined voltage level and above.

Figure 2:
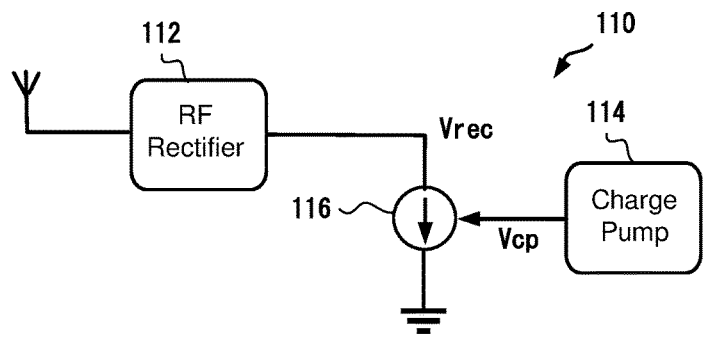
FIG. 2 depicts an schematic of DC voltage limiting circuit using a charge pump in accordance with one or more embodiments of the present disclosure.

FIG. 2 depicts schematic of a DC voltage limiter 110 using a charge pump 114. The voltage limiter 110 may incorporated in a RFID integrated circuit (IC) that may include other components to allow a RFID tag that incorporates the RFID IC to communicate with an external RFID reader. The RFID IC typically includes necessary electronic components and the RFID IC may be coupled with an antenna that is incorporated in the RFID tag. A RF rectifier 112 is used for generating a DC voltage (Vrec) from the AC signal received from a reader (not shown) through an RFID tag antenna. A current sink device 116 is included and driven by the charge pump 114. The current sink device 116 and the charge pump 114 may be configured to the voltage Vrec to a predefined voltage level that may be configurable (e.g., 2V, 2.5V, etc.). The voltage Vrec is used by other components (not shown) of the RFID tag. The charge pump 114 is a DC-to-DC converter that uses capacitors for energetic charge storage to raise or lower voltage with high conversion efficiency that may be up to about 95%. In some embodiments, the current sink device 116 may be implemented using one or more transistors. The current sink device 116 has a threshold voltage (Vth). If the difference between Vrec and the output voltage (Vcp) of the charge pump 114 is greater than Vth, the current sink device 116 starts to conduct to sink the excess current. If the difference between Vrec and Vcp is less than Vth, the current sink device 116 stays non-conductive (except for a small leakage current) and when the difference between Vrec and Vcp is more than Vth, the current sink device 116 starts to conduct and sinks a current proportional a voltage=Vrec−Vcp−Vth. In some examples, by choosing a desired Vth transistor used for the implementation of the current sink device 116, the predefined voltage level may be altered.

Figure 3:
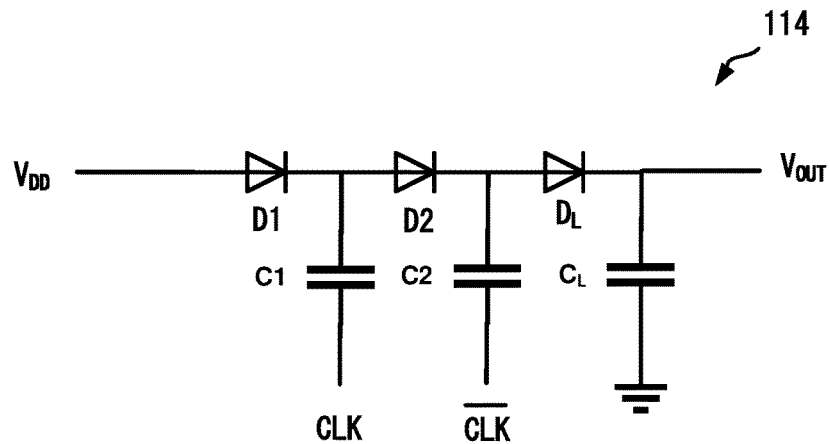
FIG. 3 shows a simplified charge pump circuit in accordance of one or more embodiments of the present disclosure.

FIG. 3 shows a simplified charge pump circuit 114. Many different implementations are possible. The simplified charge pump circuit 114 shown herein is for example only. The charge pump 114 may include diodes D1 and D2 that may also be implemented using source-gate coupled transistors. The diode D1 is coupled with a clock signal through a capacitor C1. The diode D2 may be coupled with the inverse of the clock through a capacitor C2. The capacitors C1 and C2 may have a same value in some examples. The output of the diode D2 is coupled with a diode $D_L$ that is coupled with ground through a capacitor $C_L$. The output of the diode $D_L$ provides an output voltage $\backslash T_{our}$ (e.g., Vcp in FIG. 2). The input voltage $V_{DD}$ to the diode D1 may be Vrec or a different voltage Vreg that may be derived from Vrec using a voltage regulator. The circuit shown in FIG. 3 represents one stage of the charge pump.

Figure 4:
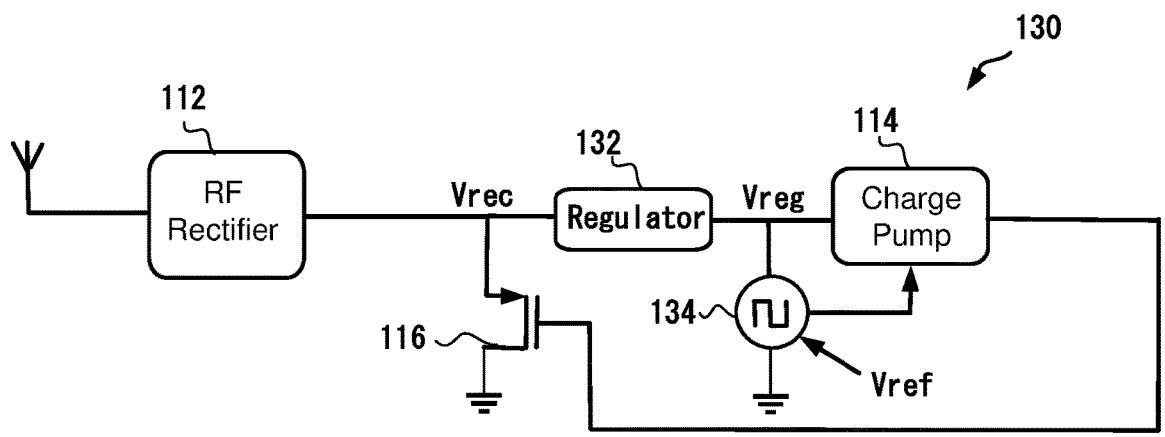
FIG. 4 shows a DC voltage limiter circuit in accordance with one or more embodiments of the present disclosure.
Figure 5:
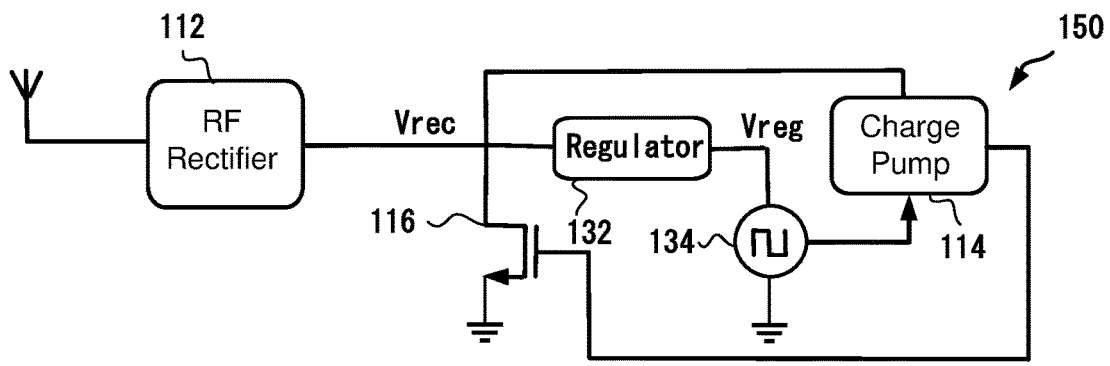
FIG. 5 shows a DC voltage limiter circuit in accordance with one or more embodiments of the present disclosure.

FIG. 4 shows an implementation 130 of the DC voltage limiter 110. The DC voltage limiter 110 in this implementation uses a PMOS based current sink device 116 that is coupled between Vrec and ground and the output (Vcp) of the charge pump 114 drives the gate of the PMOS transistor. In other embodiments such as shown in FIG. 5, NMOS device may also be used to implement the current sink device 116. In some embodiments, a voltage regulator 132 may be used to derive the regulated voltage Vreg that may be a non-varying DC voltage. The charge pump 114 produces Vcp corresponding to Vreg. Vcp may be varying by changing a clock frequency that may be generated using a clock generator 134. In some examples, the clock frequency may also be controlled by a reference voltage Vref. Vrec or Vreg may be used to power other components of the RFID tag. The reference voltage Vref may be derived from Vrec. In some examples, the voltage Vref tracks the voltage Vrec. Therefore, if Vrec goes down, Vref also goes down, and finally Vcp also goes down. Hence, the DC voltage limiter 110 may also work as a voltage regulator to keep the current to the RFID tag circuit constant by sinking an amount of current proportional to the difference between Vrec and Vcp.

FIG. 5 shows another implementation 150 of the DC voltage limiter 110. In this implementation, the input voltage VDD to the charge pump 114, is coupled with Vrec. Hence, Vcp tracks the voltage Vrec. In this embodiment, a non-varying clock generator circuit may be used (i.e., the reference voltage Vref may not be needed). In this implementation, the clock generator 134 may not need to be a voltage controlled clock generator 134 of the implementation 130 of the DC voltage limiter 110 because a fixed frequency clock generator may be simpler to implement or an existing fixed frequency clock that is already available in the RFID tag may be used.

Figure 6:
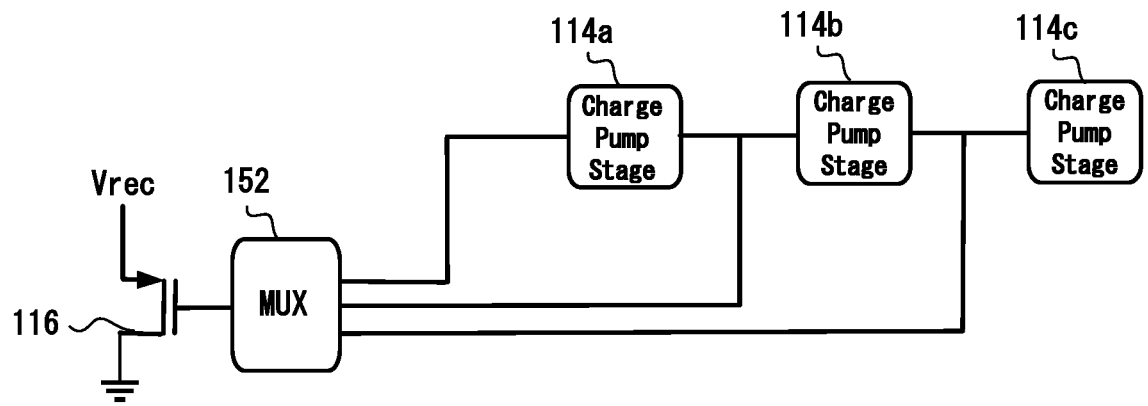
FIG. 6 shows a circuit to use individual stages of a charge pump for fine control of a DC voltage limiter in accordance with one or more embodiments of the present disclosure.

FIG. 6 shows a circuit to use individual stages of a charge pump for fine control of a DC voltage limiter 110. As explained in FIG. 3, a plurality of charge pumps may be coupled in series. Each subsequent stage may boost the voltage received from a previous stage. Using a multiplexer (MUX) 152, a selected number of charge pump stages 114*a*, 114*b*, 114*c* may be used to precisely control Vcp to a desired voltage using a control signal to select one of the inputs to the MUX 152.

Figure 7:
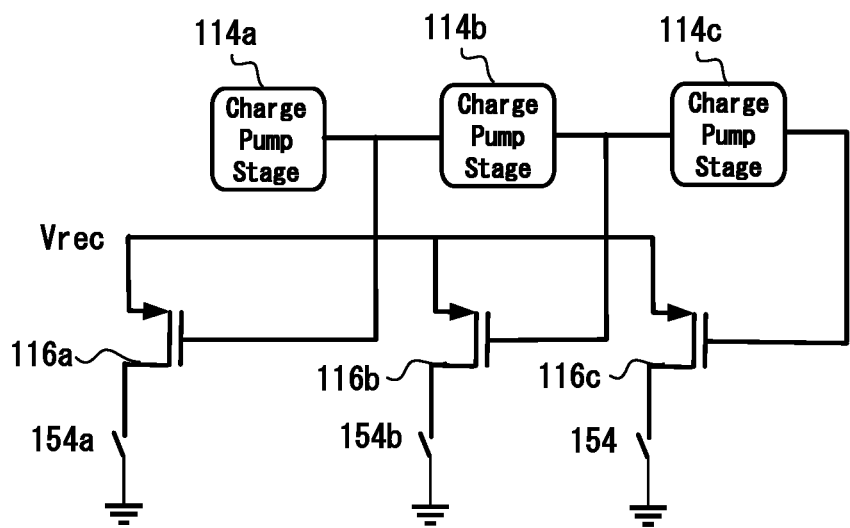
FIG. 7 shows a circuit to use individual stages of a charge pump for fine control of a DC voltage limiter in accordance with one or more embodiments of the present disclosure.

FIG. 7 shows a circuit to use individual stages 114*a*, 114*b*, 114*c* of a charge pump for fine control of the DC voltage limiter 110. In this implementation, each charge pump 114*a*, 114*b*, 114*c* may drive a separate current sink device 116*a*, 116*b*, 116*c* for a finer control of the amount of current needs to be sunk. In some examples, each of the separate current sink device 116*a*, 116*b*, 116*c* may be of a same type (e.g., implemented using NMOS or PMOS, but all same type either NMOS or PMOS) and geometry (e.g., different threshold voltages). In other words, each of the separate current sink device 116*a*, 116*b*, 116*c* may have a same or similar electrical characteristics. In other examples, some or all of the separate current sink device 116*a*, 116*b*, 116*c* may be have different electrical characteristics. In some examples, the switches 154*a*, 154*b*, 154*c* may be used to electrically enable or disable individual current sink devices 116*a*, 116*b*, 116*c*.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A voltage limiter incorporated in a radio frequency identification (RFID) integrated circuit (IC) for a RFID tag, the RFID IC including a radio frequency (RF) rectifier and a clock generator, the voltage limiter comprising:
   a current sink device coupled between output of the RF rectifier and ground; and
   a charge pump to control conduction of current through the current sink device to limit output voltage of the RF rectifier to a predefined voltage level,
   wherein the RF rectifier is configured to convert an AC signal received from an antenna incorporated in the RFID tag to a DC signal.

2. The voltage limiter of claim 1, wherein output of the charge pump is controlled by a clock signal generated by the clock generator.

3. The voltage limiter of claim 2, wherein the charge pump includes a first port and a second port, wherein the first port is coupled with the clock signal and the second port is coupled with inverse of the clock signal.

4. The voltage limiter of claim 2, wherein frequency of the clock signal is controlled by a reference voltage that is derived from the output of the RF rectifier.

5. The voltage limiter of claim 2, wherein a power supply port of the clock generator is coupled with the output of the RF rectifier.

6. The voltage limiter of claim 5, wherein a voltage regulator is coupled between the output of the RF rectifier and the power supply port of the clock generator is coupled with the output of the RF rectifier.

7. The voltage limiter of claim 6, wherein frequency of the clock signal is controlled by a reference voltage signal that is derived from the output of the RF rectifier.

8. The voltage limiter of claim 1, wherein input of the charge pump is coupled with the output of the RF rectifier.

9. The voltage limiter of claim 8, wherein a voltage regulator is coupled between the output of the RF rectifier and input of the charge pump.

10. The voltage limiter of claim 1, wherein the current sink device include one of more transistors, wherein one or more gates of the one of more transistors are coupled with the output of the charge pump.

11. The voltage limiter of claim 1, further including a multiplexer having a plurality of input ports and one output port, wherein the multiplexer is configured to connect a selected input port in the plurality of input ports to the one output port.

12. The voltage limiter of claim 11, wherein the charge pump includes a plurality of stages having a plurality of outputs, each of the plurality of outputs is coupled with the plurality of input ports of the multiplexer.

13. The voltage limiter of claim 1, wherein the current sink device includes a plurality of transistors having a plurality of gates and the charge pump includes a plurality of stages having a plurality of outputs, wherein the plurality of outputs of the plurality of stages are coupled with the plurality of gates.

14. The voltage limiter of claim 13, wherein the plurality of transistors are coupled between the output of the RF rectifier and ground.

15. The voltage limiter of claim 14, wherein a plurality of switches are coupled between the plurality of transistors and ground.

* * * * *